US011585332B2

(12) United States Patent
Hattori et al.

(10) Patent No.: US 11,585,332 B2
(45) Date of Patent: Feb. 21, 2023

(54) ELECTRIC COMPRESSOR

(71) Applicant: MITSUBISHI HEAVY INDUSTRIES THERMAL SYSTEMS, LTD., Tokyo (JP)

(72) Inventors: Makoto Hattori, Tokyo (JP); Hiroyuki Kamitani, Tokyo (JP); Hiroto Higuchi, Tokyo (JP); Takayuki Takashige, Tokyo (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 184 days.

(21) Appl. No.: 16/348,422

(22) PCT Filed: Nov. 1, 2017

(86) PCT No.: PCT/JP2017/039524
§ 371 (c)(1),
(2) Date: May 8, 2019

(87) PCT Pub. No.: WO2018/088298
PCT Pub. Date: May 17, 2018

(65) Prior Publication Data
US 2019/0309740 A1   Oct. 10, 2019

(30) Foreign Application Priority Data
Nov. 11, 2016 (JP) .............................. JP2016-220657

(51) Int. Cl.
  F04B 35/04   (2006.01)
  H02K 11/33   (2016.01)
(Continued)

(52) U.S. Cl.
  CPC .............. *F04B 35/04* (2013.01); *F04B 39/12* (2013.01); *F04B 39/14* (2013.01); *F04C 23/008* (2013.01);
(Continued)

(58) Field of Classification Search
  CPC ........ F04B 35/04; F04B 39/121; F04B 39/14; F04B 39/00; F04B 39/12; F04C 2240/808;
(Continued)

(56) References Cited

U.S. PATENT DOCUMENTS

2005/0167155 A1   8/2005   Matsuo
2005/0223727 A1*  10/2005  Funahashi ............. F04B 39/121
                                                        62/228.4
(Continued)

FOREIGN PATENT DOCUMENTS

CN   101235811 A   8/2008
CN   102889194 A   1/2013
(Continued)

OTHER PUBLICATIONS

International Search Report dated Feb. 6, 2018, for International Application No. PCT/JP2017/039524, with an English translation.
(Continued)

*Primary Examiner* — Dominick L Plakkoottam
(74) *Attorney, Agent, or Firm* — Birch, Stewart, Kolasch & Birch, LLP (57) ABSTRACT

An electric compressor includes: a circuit board on which a plurality of switching elements (33) are mounted; a compression mechanism which is driven by a motor operated using AC power output from the switching elements (33); and a lead holding member (50) disposed between element main bodies (33*a*) of the switching elements (33) and the circuit board. The circuit board includes a plurality of
(Continued)

through-holes through which a plurality of leads (33b) that extend from the element main bodies (33a) can be respectively inserted. The lead holding member (50) includes lead insertion holes (53) through which the leads (33b) can be inserted such that positions of the leads (33b) is held at positions that correspond to positions of the through-holes.

4 Claims, 6 Drawing Sheets

(51) Int. Cl.
    *F04C 23/00*         (2006.01)
    *F04B 39/12*         (2006.01)
    *F04B 39/14*         (2006.01)
    *H05K 3/30*          (2006.01)

(52) U.S. Cl.
    CPC ............. *H02K 11/33* (2016.01); *H05K 3/306* (2013.01); *F04C 2240/808* (2013.01)

(58) Field of Classification Search
    CPC .............. F04C 23/008; F04C 2240/803; F04C 29/0085; F04C 29/047
    See application file for complete search history.

(56) References Cited

U.S. PATENT DOCUMENTS

| | | | |
|---|---|---|---|
| 2006/0064998 A1* | 3/2006 | Funahashi | F01C 21/10 62/228.4 |
| 2008/0181791 A1 | 7/2008 | Iguchi et al. | |
| 2008/0205107 A1 | 8/2008 | Hattori et al. | |
| 2013/0021753 A1* | 1/2013 | Enami | H05K 7/2049 361/709 |
| 2013/0224050 A1* | 8/2013 | Nakagami | F01C 21/10 417/410.1 |
| 2014/0377094 A1 | 12/2014 | Yano et al. | |
| 2014/0377095 A1 | 12/2014 | Yano et al. | |
| 2015/0285256 A1 | 10/2015 | Nakagami et al. | |
| 2015/0295467 A1* | 10/2015 | Hattori | H02K 11/02 310/71 |
| 2016/0020657 A1* | 1/2016 | Hattori | F04B 39/14 310/71 |
| 2016/0111942 A1* | 4/2016 | Hattori | H02K 11/02 310/72 |
| 2016/0245269 A1* | 8/2016 | Nagata | F04B 49/06 |
| 2017/0302139 A1* | 10/2017 | Sakai | H02K 15/00 |

FOREIGN PATENT DOCUMENTS

| | | |
|---|---|---|
| CN | 104251212 A | 12/2014 |
| CN | 105247210 A | 1/2016 |
| DE | 10 2015 221 535 A1 | 5/2015 |
| JP | 9-8182 A | 1/1997 |
| JP | 2003-23777 A | 1/2003 |
| JP | 2005-217160 A | 8/2005 |
| JP | 2011-163148 A | 8/2011 |
| JP | 2014-131445 A | 7/2014 |
| JP | 2014-217223 A | 11/2014 |
| JP | 2015-053241 A | 3/2015 |
| JP | 2016-82719 A | 5/2016 |
| WO | WO 2016/059771 A1 | 4/2016 |

OTHER PUBLICATIONS

Written Opinion of the International Searching Authority, dated Feb. 6, 2018, for International Application No. PCT/JP2017/039524, with an English translation.

\* cited by examiner

ELECTRIC COMPRESSOR

TECHNICAL FIELD

The present invention relates to an electric compressor.
Priority is claimed on Japanese Patent Application No. 2016-220657, filed on Nov. 11, 2016, the content of which is incorporated herein by reference.

BACKGROUND ART

For example, in a vehicle-mounted air conditioner, high space saving properties are required because of the need to accommodate various components in a limited space in a vehicle. Therefore, in recent years, in order to improve the space saving properties, there is provided an electric compressor integrally including a compressor that configures the vehicle-mounted air conditioner, a motor that drives the compressor, and a circuit board that controls the motor.

A circuit board used for the electric compressor converts DC power supplied from a power source into three-phase AC power and supplies the three-phase AC power to the motor. Therefore, switching elements, such as an IGBT, are mounted on the circuit board in order to generate the three-phase AC power (for example, refer to PTL 1).

The switching elements are provided corresponding to each of a U phase, a V phase, and a W phase that form a three-phase alternating current. Therefore, at least three sets of switching elements are provided. Each of the switching elements has a plurality of leads, and each of the leads is connected to the circuit board.

Incidentally, when mounting the switching element on the circuit board, it is necessary to insert a large number of leads provided in the plurality of switching elements into different through-holes formed on the circuit board, respectively, and this takes time and effort.

In particular, after fixing the plurality of switching elements to a casing of the electric compressor, there is a case where the circuit board is assembled in the casing. In this case, it is necessary that the through-holes of the circuit board simultaneously pass through the plurality of leads of the plurality of switching elements fixed to the casing first.

CITATION LIST

Patent Literature

[PTL 1] Japanese Unexamined Patent Application, First Publication No. 2014-217223

SUMMARY OF INVENTION

Technical Problem

However, due to deformation of the lead of the switching element, an error at an attachment position of the switching element to the casing, or the like, there is a case where distal end positions of the plurality of leads are deviated from a predetermined position. In this case, it becomes difficult to simultaneously insert the plurality of leads into different through-holes of the circuit board.

The present invention provides an electric compressor capable of easily and reliably connecting a plurality of leads of a switching element to a circuit board to improve the efficiency of assembly work.

Solution to Problem

According to a first aspect of the present invention, there is provided an electric compressor including: a circuit board on which a plurality of switching elements that are configured to convert DC power supplied from an outside into AC power are mounted; a motor rotationally driven by the AC power output from the plurality of switching elements; a compression mechanism which is driven by the motor and is configured to compress a fluid; and a lead holding member disposed between element main bodies of the plurality of switching elements and the circuit board, in which the circuit board includes a plurality of through-holes through which a plurality of leads that extend from the element main bodies can be respectively inserted, and in which the lead holding member includes lead insertion holes through which the plurality of leads are inserted such that positions of the plurality of leads are held at positions that correspond to positions of the through-holes.

With the configuration, the lead is held at a predetermined position only by inserting the lead into the lead insertion hole of the lead holding member. Accordingly, it is possible to correct deformation or positional deviation of the lead. Therefore, the deformation or the positional deviation of the lead with respect to the circuit board is suppressed. As a result, the work of connecting the leads of the switching element to the circuit board can be easily performed.

In addition, according to a second aspect of the present invention, in the electric compressor of the first aspect, the lead insertion hole may be tapered such that an inner diameter gradually decreases from the one of element main bodies side toward the circuit board side.

With the configuration, when the lead of the switching element is inserted through the lead insertion hole of the lead holding member, the lead can be easily inserted.

In addition, according to a third aspect of the present invention, in the electric compressor of the first aspect of the second aspect may further include a casing in which a driving circuit accommodation portion that accommodates the circuit board and the lead holding member is formed, and the lead holding member may be provided to cover at least a part of the element main bodies from the plurality of leads side with respect to the plurality of switching elements in a state of being fixed to the casing in the driving circuit accommodation portion.

With the configuration, the lead can be easily connected to the circuit board by holding the lead by the lead holding member even with respect to the switching element fixed to the driving circuit accommodation portion in advance.

In addition, according to a fourth aspect of the present invention, in the electric compressor of the third aspect, the element main bodies may be fixed to the casing by a fixing screws, and the lead holding member may cover only a part of the element main bodies so as to expose the fixing screws.

In addition, according to a fifth aspect of the present invention, in the electric compressor of in the third aspect or the fourth aspect, the element main bodies may be fixed to the casing by fixing screws, and the lead holding member may have opening portions at positions that corresponds to the fixing screws.

With the configuration, even after the lead holding member is attached, the fixing screw of the switching element can be fastened or loosened. Therefore, in a state where the fixing screw of the switching element is temporarily fastened, after inserting the lead of the switching element through the lead insertion hole of the lead holding member, the fixing screw of the switching element can be fully fastened. Further, after the lead holding member is attached, the fixing screw can be loosened without removing the lead holding member for maintenance or the like.

In addition, according to a sixth aspect of the present invention, in the electric compressor of in any one of the first aspect to the fifth aspect may further include a motor connection member that electrically connects the motor and the circuit board to each other as a first end portion is connected to the motor and a second end portion is connected to the circuit board, and the lead holding member may include a connection member holding portion that holds the motor connection member so as to hold a position of the second end portion at a position that corresponds to a connection position with the circuit board.

With the configuration, even when the lead holding member is provided, the motor and the circuit board can be connected to each other via the motor connection member.

Advantageous Effects of Invention

According to the present invention, it becomes possible to easily and reliably connect a plurality of leads of a switching element to a circuit board to improve the efficiency of assembly work.

DESCRIPTION OF EMBODIMENTS

Hereinafter, with reference to attached drawings, embodiments for realizing an electric compressor according to the present invention will be described. However, the present invention is not limited to the embodiments.

Figure 1:
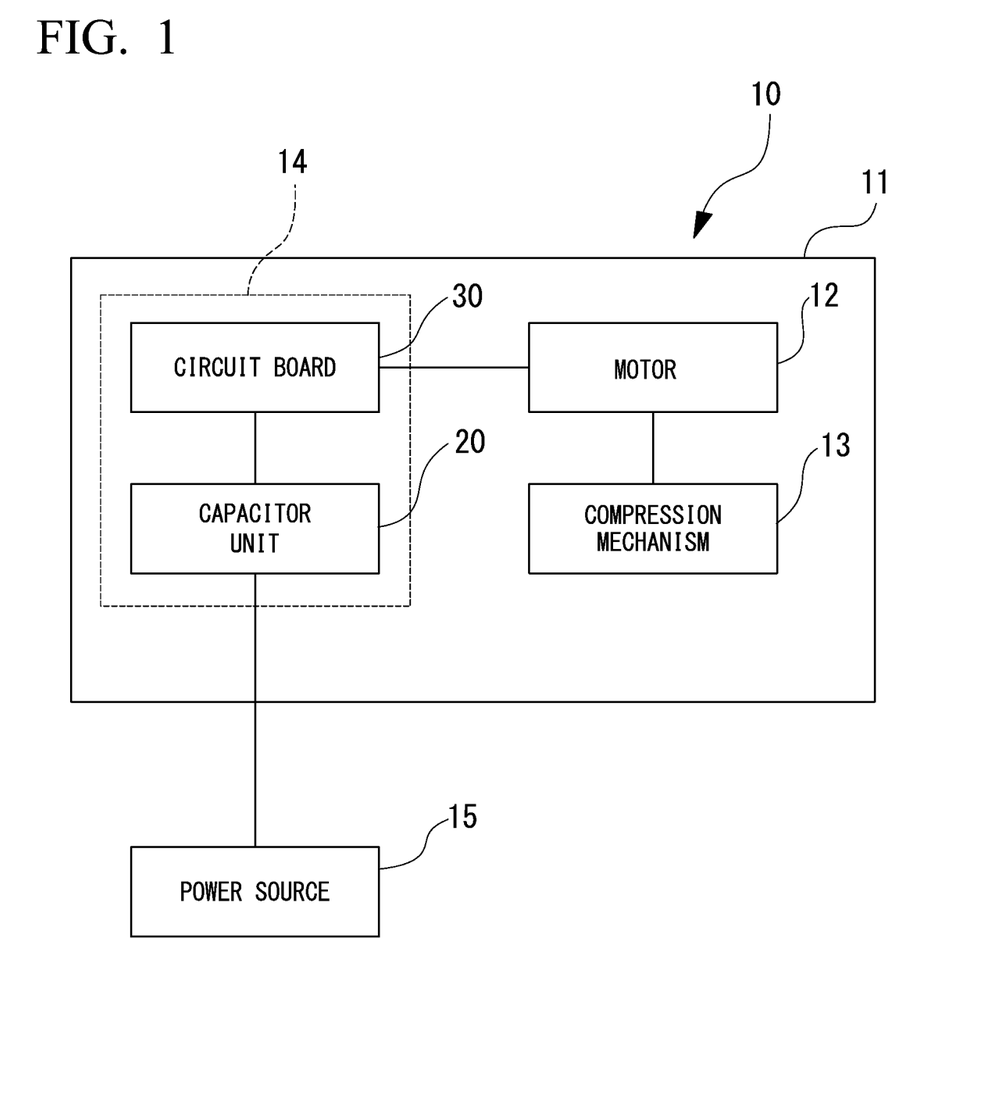
FIG. 1 is a schematic view showing a configuration of an electric compressor according to an embodiment of the present invention.
Figure 2:
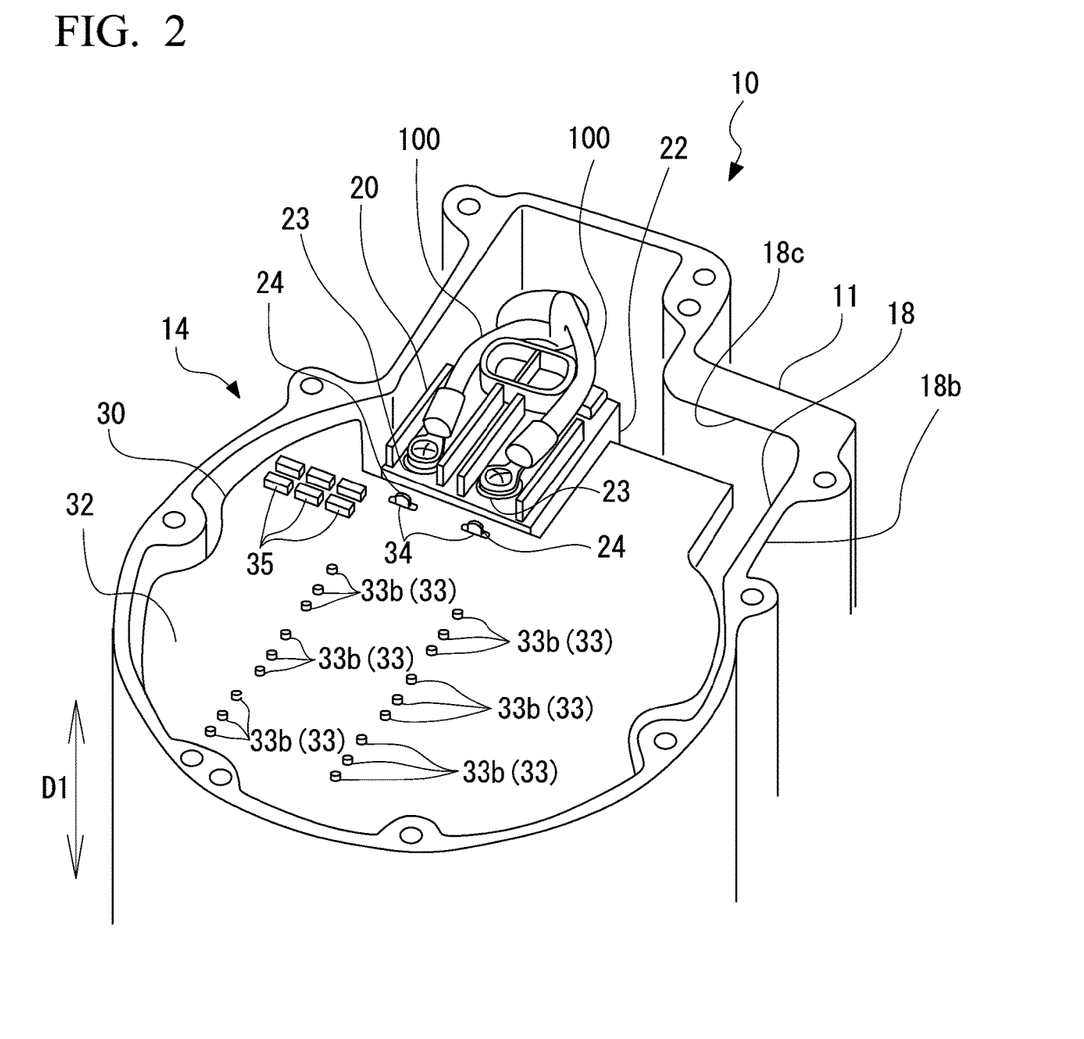
FIG. 2 is a perspective view showing a driving circuit portion provided in a driving circuit accommodation portion of the electric compressor.
Figure 3:
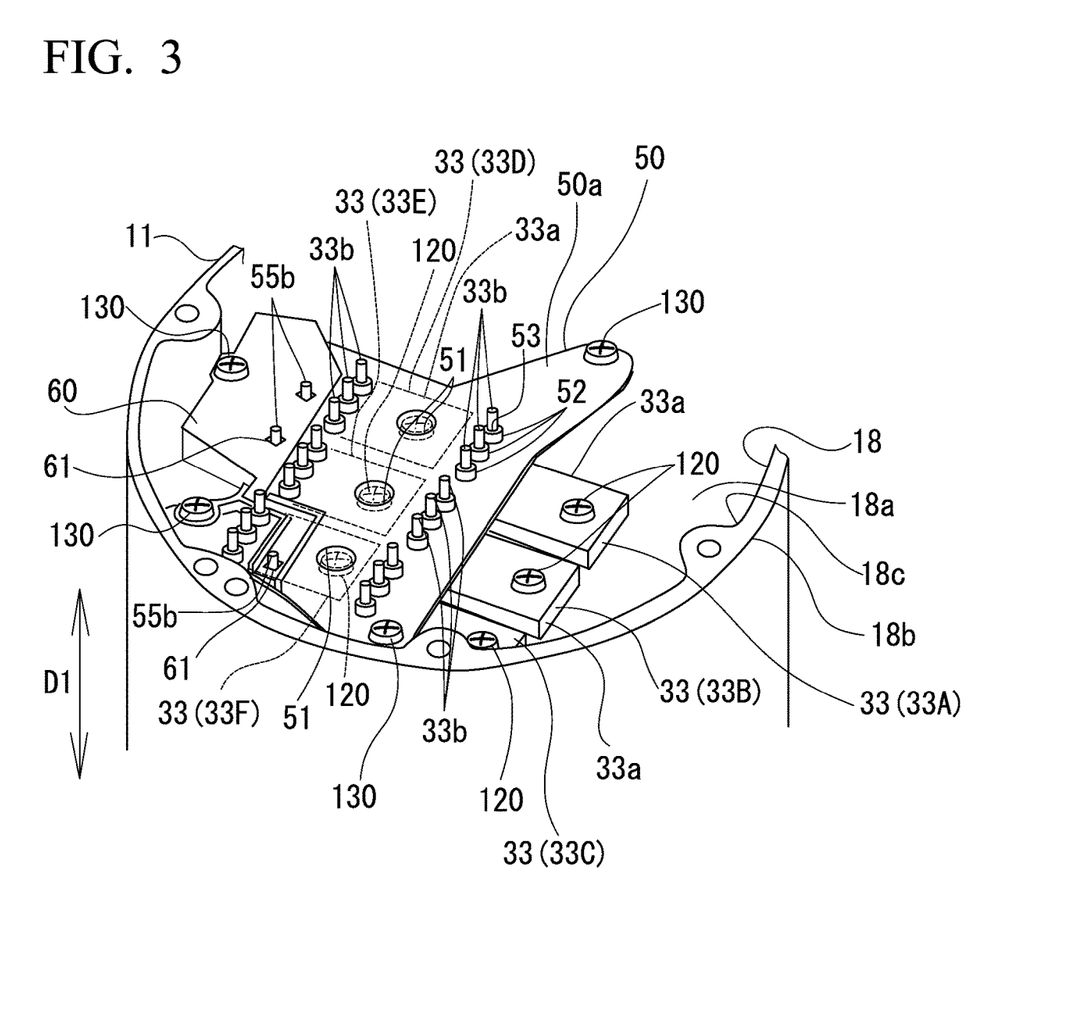
FIG. 3 is a perspective view showing a switching element fixed to the casing and a lead holding member.
Figure 4:
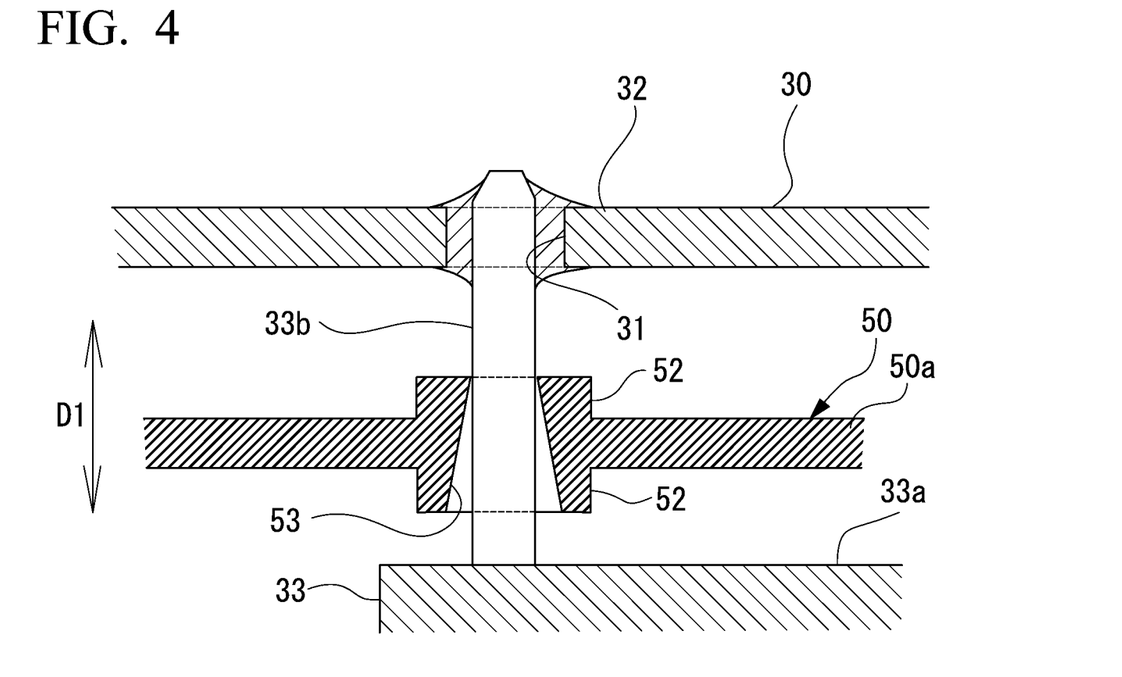
FIG. 4 is a sectional view showing a connection part of a lead of the switching element and a circuit board via the lead holding member.
Figure 5:
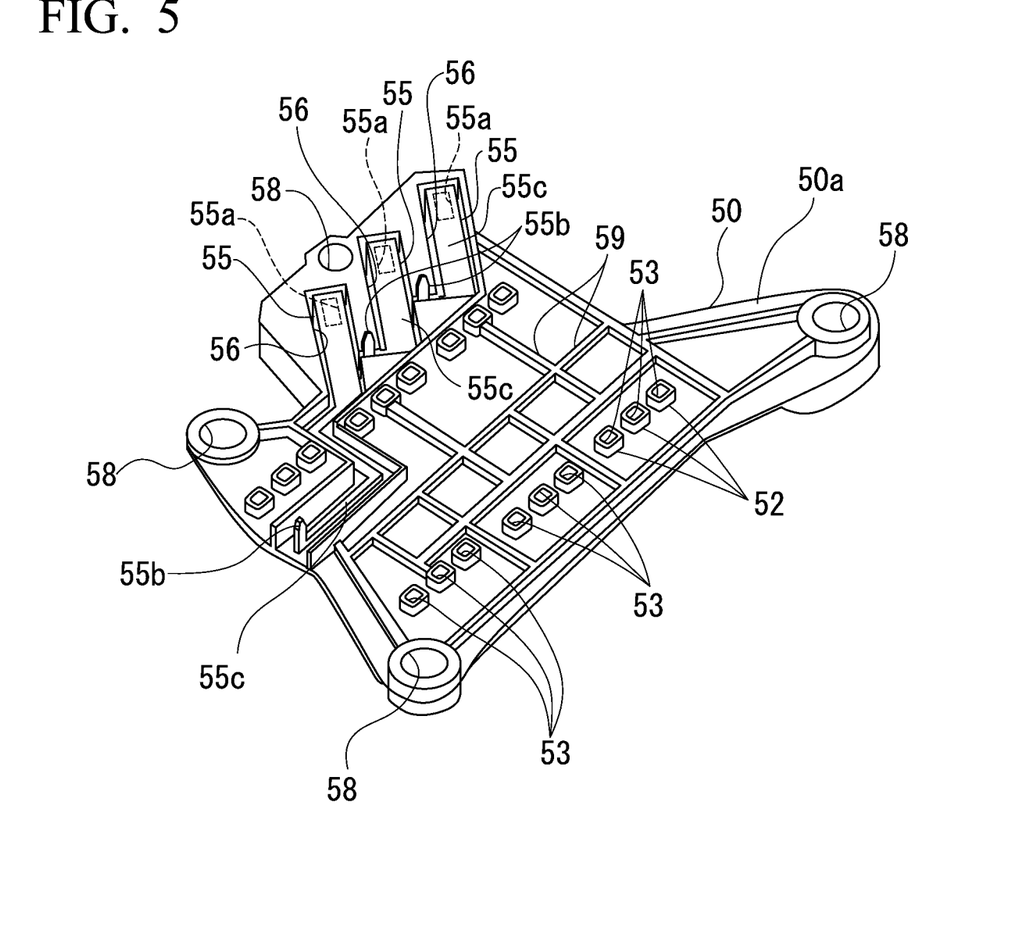
FIG. 5 is a perspective view showing a front surface side of the lead holding member.
Figure 6:
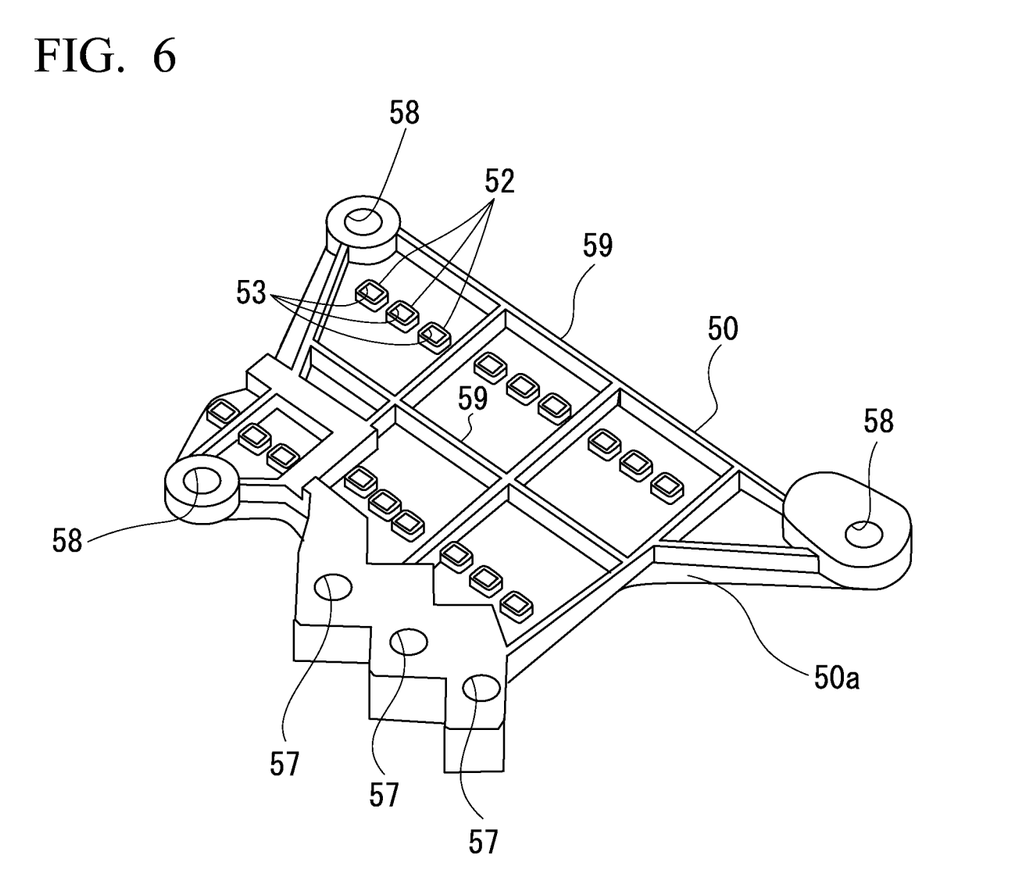
FIG. 6 is a perspective view showing a rear surface side of the lead holding member.

FIG. 1 is a schematic view showing a configuration of the electric compressor according to the embodiment of the present invention. FIG. 2 is a perspective view showing a driving circuit portion provided in a driving circuit accommodation portion of the electric compressor. FIG. 3 is a perspective view showing a switching element fixed to the casing and a lead holding member. FIG. 4 is a sectional view showing a connection part of a lead of the switching element and a circuit board via the lead holding member. FIG. 5 is a perspective view showing a front surface side of the lead holding member. FIG. 6 is a perspective view showing a rear surface side of the lead holding member.

As shown in FIG. 1, an electric compressor 10 of the present embodiment includes a casing 11, a motor 12, a compression mechanism 13, and a driving circuit portion 14. The electric compressor 10 configures a part of an air conditioner mounted on a vehicle, and compresses a refrigerant that circulates in the air conditioner.

The motor 12, the compression mechanism 13, and the driving circuit portion 14 are accommodated in the casing 11 which forms an outer shell of the electric compressor 10.

The motor 12 is rotationally driven by AC power output from a switching element 33 of the driving circuit portion 14 which will be described later. The motor 12 has a stator (not shown) and a rotor (not shown). The stator generates a magnetic field by the power supplied from a power source 15, such as a battery or a generator of the vehicle. The rotor rotates by a magnetic field generated by the stator.

The compression mechanism 13 is driven by the motor 12. The compression mechanism 13 is configured with, for example, a scroll compression mechanism. The compression mechanism 13 includes a fixed scroll (not shown) and a turning scroll (not shown). The compression mechanism 13 compresses a refrigerant (fluid) as the turning scroll is driven to turn with respect to the fixed scroll by rotation of the rotor (not shown) of the motor 12.

As shown in FIG. 2, the driving circuit portion 14 is accommodated inside a driving circuit accommodation portion 18 formed in the casing 11. The driving circuit accommodation portion 18 is an independent area for accommodating the driving circuit portion 14, which is different from the area for accommodating the motor 12 and the compression mechanism 13, inside the casing 11. The casing 11 has a bottomed shape in which one side in a first direction (attaching direction of the circuit board 30) D1 is opened. The casing 11 has a bottom portion 18a (refer to FIG. 3) which divides a space inside the casing 11 into the area for accommodating the motor 12 and the compression mechanism 13 and the driving circuit accommodation portion 18, and an outer peripheral wall portion 18b that rises from the outer peripheral portion of the bottom portion 18a. The bottom portion 18a divides the space inside the casing 11 into the area for accommodating the motor 12 and the compression mechanism 13 and the driving circuit accommodation portion 18. The outer peripheral wall portion 18b is formed by a part of the exterior of the casing 11. An opening portion 18c of the casing 11 is closed by a lid body (not shown).

The driving circuit portion 14 includes a capacitor unit 20, the circuit board 30, and a plurality (two in the present embodiment) of power source harnesses 100.

The capacitor unit 20 removes and smooths a ripple component superimposed on the DC power supplied from the power source 15, and outputs the smoothed DC power to the circuit board 30. The capacitor unit 20 includes a capacitor main body (not shown), a housing 22, a harness side terminal 23, and a board side terminal 24.

The housing 22 is made of a resin made of an insulating material and has a hollow box shape. The housing 22 accommodates a capacitor main body (not shown) on the inside thereof.

The harness side terminal 23 can be connected to the power source harness 100 for supplying the DC power from the outside to the capacitor main body. The harness side terminal 23 is made of a conductive metal.

The board side terminal 24 is disposed at a position close to the circuit board 30 in the housing 22. The board side terminal 24 can be connected to the circuit board 30 so as to output the DC power to the circuit board 30. The board side terminal 24 of the present embodiment is formed by a plate-like metal plate made of a conductive metal.

The circuit board 30 converts the DC power output from the capacitor unit 20 into the AC power and outputs the AC power to the motor 12. The circuit board 30 includes a board main body 32, a switching element 33, and a PN terminal forming portion 34.

The board main body 32 is configured with a plate-like printed board. The board main body 32 has a predetermined wiring pattern made of a conductive material, such as copper, on a front surface thereof. The board main body 32 is fixed in the driving circuit accommodation portion 18 of the casing 11 by a screw or the like (not shown).

The board side terminal 24 of the capacitor unit 20 is connected to the PN terminal forming portion 34. By connecting the board side terminal 24 to the PN terminal forming portion 34, the DC power smoothed by the capacitor unit 20 is input to the circuit board 30.

The switching element 33 converts the DC power supplied from the outside into three-phase AC power. The switching element 33 is configured with a plurality of insulated gate bipolar transistors (IGBT) or the like, and is mounted on the board main body 32. As shown in FIG. 3, in the present embodiment, six switching elements 33A to 33F are provided.

Each of the switching elements 33 switches between an ON state where a current flows and an OFF state where a current is blocked, based on a driving signal to be input from a control circuit mounted on the circuit board 30. In the present embodiment, the switching elements 33 are respectively provided two by two corresponding to each of a U phase, a V phase, and a W phase that form a three-phase alternating current. The plurality of switching elements 33 supply the three-phase (U phase, V phase, and W phase) AC power to the motor 12 by repeating ON and OFF at a predetermined timing regulated by the driving signal of the control circuit (not shown). The switching element 33 of the present embodiment includes an element main body 33a and a plurality (three in the present embodiment) of leads 33b.

The element main body 33a has a rectangular shape. The element main body 33a is fixed to the casing 11 by a fixing screw 120 in the driving circuit accommodation portion 18.

The lead 33b protrudes from the element main body 33a toward one side in the first direction D1. The lead 33b can be inserted into a through-hole 31 formed in the board main body 32. The lead 33b is electrically connected to the wiring pattern of the board main body 32 by being soldered in a state of being inserted into the through-hole 31.

In addition, the switching element 33 is typically an IGBT, but may be a bipolar transistor, a metal-oxide-semiconductor field effect transistor (MOSFET), or the like.

Further, as shown in FIG. 2, in addition to the switching element 33, the driving circuit portion 14 includes an appropriate electronic component 35 mounted on the circuit board 30.

Further, as shown in FIG. 3, the electric compressor 10 further includes a lead holding member 50. The lead holding member 50 is disposed between the element main body 33a of the switching element 33 and the board main body 32 of the circuit board 30. The lead holding member 50 is disposed so as to be sandwiched between the element main body 33a and the board main body 32 in an abutting state. The lead holding member 50 is made of an insulating material, such as resin. The lead holding member 50 has a lead holding member main body 50a. The lead holding member main body 50a has a shape of a flat plate. The lead holding member 50 is provided with respect to the switching element 33 so as to cover at least a part of the element main body 33a from the opening portion 18c side in the first direction D1. The lead holding member 50 of the present embodiment covers only a part of the element main body 33a with respect to the switching elements 33A to 33C among the plurality of switching elements 33. The lead holding member 50 covers all of the element main bodies 33a with respect to the switching elements 33D to 33F among the plurality of switching elements 33.

Specifically, in the lead holding member main body 50a, an area when viewed in the first direction D1 is smaller than that of the circuit board 30. Accordingly, when viewed from the opening portion 18c side (one side in the first direction D1) that opposes the bottom portion 18a, in some of the switching elements 33A to 33C among the plurality of switching elements 33, a part of the element main body 33a protrudes laterally from the lead holding member main body 50a. Each of the element main bodies 33a of the switching elements 33A to 33C is fixed to the bottom portion 18a of the casing 11 by the fixing screw 120 at a part that protrudes laterally from the lead holding member main body 50a.

Further, in the remaining switching elements 33D to 33F among the plurality of switching elements 33, when viewed from the opening portion 18c side, all of the element main bodies 33a are respectively covered with the lead holding member main body 50a. The lead holding member main body 50a has an opening portion 51 at a position that corresponds to a position at which the fixing screw 120 for fixing the element main body 33a of the switching elements 33D to 33F to the bottom portion 18a of the casing 11. The opening portion 51 is a through-hole having a size through which the fixing screw 120 can be inserted. By inserting a tool, such as a driver, through the opening portion 51, it is possible to visually recognize and rotate the fixing screw 120.

As shown in FIGS. 3 to 6, the lead holding member 50 has thick portions 52 formed at positions that correspond to each of the leads 33b of the switching elements 33A to 33F. Each of the thick portions 52 respectively protrudes from the lead holding member main body 50a on both the board main body 32 side and the element main body 33a side in a thickness direction which is the first direction D1 in the lead holding member main body 50a. The lead holding member 50 has a lead insertion hole 53 that penetrates the center of the thick portion 52. The lead 33b can be inserted through the lead insertion hole 53. The lead insertion holes 53 are formed such that the positions of the plurality of leads 33b are held at positions that correspond to the positions of the through-holes 31. Specifically, when the board main body 32 is fixed on the element main body 33a, the lead insertion hole 53 guides the lead 33b to a position that matches the position of the through-hole 31. As shown in FIG. 4, each of the lead insertion holes 53 is tapered such that an inner diameter gradually decreases, from the element main body 33a side (surface side that opposes the element main body 33a) in the thickness direction of the lead holding member main body 50a toward the circuit board 30 side (surface side that opposes the board main body 32).

As shown in FIGS. 5 and 6, reinforcement ribs 59 are appropriately formed on both surfaces of the lead holding member main body 50a.

As shown in FIG. 5, in the lead holding member 50, a motor connection member 55 is provided on the circuit board 30 side in the thickness direction. The motor connection member 55 is made of a conductive metal. A total of three motor connection members 55 are provided corresponding to each of the U phase, the V phase, and the W phase terminals of the motor 12.

The motor connection member 55 has a motor side connection portion (first end portion) 55a connected to the terminals of the motor 12, a board side connection portion (second end portion) 55b connected to the circuit board 30, and a linking portion 55c that links the motor side connection portion 55a and the board side connection portion 55b which are disposed at positions separated from each other.

The motor side connection portion 55a is a recess portion opened toward the element main body 33a side in the thickness direction of the lead holding member main body 50a. The motor side connection portion 55a is provided in accordance with the connection position with the terminal of the motor 12. The board side connection portion 55b protrudes toward the circuit board 30 side in the thickness direction of the lead holding member main body 50a. The board side connection portion 55b is provided in accordance with the connection position with the circuit board 30. The linking portion 55c connects the motor side connection portion 55a and the board side connection portion 55b different in position in the same plane. The linking portion 55c bends and extends along the front surface of the circuit board 30 a plurality of times.

The lead holding member 50 includes a connection member holding portion 56 that holds the motor connection member 55. The connection member holding portion 56 is a recess portion that accommodates each of the motor connection members 55. The connection member holding portion 56 accommodates the motor connection member 55 so as to hold the position of the board side connection portion 55b at a position that corresponds to the connection position with the board main body 32.

As shown in FIG. 6, in the connection member holding portion 56, a terminal insertion hole 57 opened on the bottom portion 18a side of the casing 11 is formed. The terminal insertion hole 57 is formed at a position that opposes the motor side connection portion 55a when each of the motor connection members 55 is accommodated in the connection member holding portion 56. In other words, when the lead holding member main body 50a is fixed to the casing 11, the terminal insertion hole 57 is formed at a position that corresponds to the connection position with the terminal of the motor 12.

A terminal (not shown) of the motor 12 penetrates the bottom portion 18a of the casing 11 and protrudes within the driving circuit accommodation portion 18. When the lead holding member 50 is fixed to the bottom portion 18a of the casing 11, each of the terminals (not shown) of the motor 12 is inserted into the motor side connection portion 55a through the terminal insertion holes 57. Accordingly, each of the terminals of the motor 12 and each of the motor connection members 55 are connected to each other.

As shown in FIG. 3, the connection member holding portion 56 is covered from the circuit board 30 side by a cover 60. The cover 60 is made of an insulating material, such as resin. The cover 60 includes a through-hole 61 through which the board side connection portion 55b of each of the motor connection members 55 penetrates.

As shown in FIG. 5, the lead holding member 50 has bolt insertion holes 58 at a plurality of locations on the outer peripheral portion thereof. Here, one of the plurality of bolt insertion holes 58 is disposed in the vicinity of the motor side connection portion 55a of the plurality of motor connection members 55. Bolts 130 can be inserted through the bolt insertion holes 58.

As shown in FIG. 3, the lead holding member 50 is fixed to the casing 11 by fastening the bolts 130 inserted through each of the bolt insertion holes 58 to screw holes (not shown) formed in the bottom portion 18a of the casing 11.

As shown in FIG. 4, in a state where the lead holding member 50 is fixed to the bottom portion 18a of the casing 11, each of the leads 33b of the switching element 33 protrudes to the circuit board 30 side through the lead insertion hole 53. Further, in each of the motor connection members 55 in which the terminal (not shown) of the motor 12 is connected to the motor side connection portion 55a, the board side connection portion 55b protrudes to the circuit board 30 side from the lead holding member main body 50a.

In this state, as the circuit board 30 is disposed so as to cover the lead holding member 50, the position of each of the leads 33b of the switching element 33 that protrudes from the lead holding member 50 and the position of the through-hole 31 match each other. As a result, the lead 33b is inserted into the through-hole 31 and is electrically connected to the board main body 32 by being soldered.

Further, the position of the board side connection portion 55b of the motor connection member 55 that protrudes from the lead holding member 50 matches the position of the through-hole (not shown) different from the through-hole 31 into which the lead 33b is inserted. As a result, the board side connection portion 55b is inserted into the through-hole (not shown) formed on the circuit board 30 and is electrically connected to the board main body 32 by being soldered.

In order to assemble the driving circuit portion 14 of the electric compressor 10 as described above, first, the switching element 33 is fixed to the bottom portion 18a by the fixing screw 120 with respect to the driving circuit accommodation portion 18 in a state where the terminal of the motor 12 protrudes.

Next, as shown in FIG. 3, the lead holding member 50 is moved from the opening portion 18c side of the driving circuit accommodation portion 18 toward the bottom portion 18a side, and the lead holding member 50 is disposed on the element main body 33a of the switching element 33. At this time, the opening area is expanded on the switching element 33 side as the lead insertion hole 53 has a tapered shape. Therefore, the lead 33b of each of the switching elements 33 can be easily inserted. In addition, when each of the leads 33b of the switching element 33 is inserted into each of the lead insertion holes 53, the inner diameter of the lead insertion hole 53 gradually decreases toward the circuit board 30 side, and accordingly, even when the position of the lead 33b is deviated by the deformation or the like before the insertion, it is possible to correct the position of the lead 33b. Accordingly, the plurality of leads 33b are aligned with predetermined position accuracy.

In addition, the terminal (not shown) of the motor 12 is inserted into the terminal insertion hole 57 of the lead holding member 50. When the lead holding member 50 is disposed, the fixing screw 120 of the switching element 33 may not be fully fastened, but may be temporarily fastened. Accordingly, when the lead 33b is inserted into the lead insertion hole 53, and when the position of the lead 33b is deviated with respect to the lead insertion hole 53, the position of the lead 33b is corrected by the tapered lead insertion hole 53, and the position itself of the switching element 33 is adjusted.

After inserting the lead 33b of the switching element 33 through the lead insertion hole 53 of the lead holding member 50, the temporarily fastened fixing screw 120 is fully fastened. Accordingly, the switching element 33 is fixed.

Next, as shown in FIG. 5, the cover 60 is fixed to the lead holding member main body 50a so as to cover the connection member holding portion 56. In a state where the cover 60 is set, the board side connection portion 55b of each of the motor connection members 55 penetrates the through-hole 61 of the cover 60 and protrudes to the circuit board 30 side. In other words, according to the cover 60, only the board side connection portion 55b connected to the circuit board 30 protrudes to the circuit board 30 side. Accordingly, since the other part of the motor connection member 55 is covered with the cover 60, it is possible to prevent unnecessary short circuit with the circuit board 30 side.

As shown in FIG. 3, after setting the lead holding member 50 in this manner, the lead holding member 50 is fixed to the bottom portion 18a of the casing 11 by the bolt 130. For example, the cover 60 may be configured to be jointly fastened to the lead holding member 50 by the bolt 130.

After this, the capacitor unit 20 is fixed to the bottom portion 18a of the casing 11 by a screw (not shown) or the like.

Next, the circuit board 30 is set on the lead holding member 50. At this time, each of the leads 33b of the plurality of switching elements 33 is aligned with the predetermined position accuracy by being inserted through the lead insertion holes 53. Further, the board side connection portion 55b of the motor connection member 55 is also aligned with the predetermined position accuracy by being inserted through the through-hole 61 of the cover 60. Accordingly, each of the leads 33b of the switching element 33 and the board side connection portion 55b of the motor connection member 55 can be easily inserted into the through-holes 31 of the circuit board 30.

After setting the circuit board 30, the circuit board 30 is fixed to the casing 11 by the screw or the like (not shown). Accordingly, the assembly of the driving circuit portion 14 using the lead holding member 50 is completed.

According to the above-described electric compressor 10, the lead 33b is held at a predetermined position only by inserting the lead 33b through the lead insertion hole 53 of the lead holding member 50. Accordingly, it is possible to correct deformation or positional deviation of the lead 33b. Therefore, the deformation or the positional deviation of the lead 33b with respect to the circuit board 30 is suppressed. As a result, the work of connecting the leads 33b of the switching element 33 to the circuit board 30 can be easily performed. Therefore, it becomes possible to easily and reliably connect the plurality of leads 33b to the circuit board 30 to improve the efficiency of the assembly work of the electric compressor 10. In addition, it is possible to suppress vibration of the lead 33b of the switching element 33, and to enhance vibration resistance.

In addition, since the lead insertion hole 53 has a tapered shape, when the lead 33b of the switching element 33 is inserted through the lead insertion hole 53 of the lead holding member 50, the lead 33b can be easily inserted.

In addition, the circuit board 30 can be easily connected to the switching element 33 fixed to the bottom portion 18a of the casing 11 in advance. Specifically, since the switching element 33 is fixed to the casing 11 first, there is a case where the positions of the plurality of leads 33b are deviated due to an error at the attachment position of the element main body 33a to the casing 11. Even in such a case, by holding the lead 33b by the lead holding member 50, the lead 33b can be easily connected to the circuit board 30.

Further, in the switching elements 33A to 33C, at least a part of the element main body 33a protrudes laterally from the lead holding member 50, and the fixing screw 120 is exposed. Furthermore, the lead holding member 50 has the opening portion 51 at a position that corresponds to the fixing screw 120 of the switching elements 33D to 33F. With the configuration, even after the lead holding member 50 is attached, the fixing screw 120 of the switching element 33 can be fastened or loosened. Therefore, in a state where the fixing screw 120 of the switching element 33 is temporarily fastened, after inserting the lead 33b of the switching element 33 through the lead insertion hole 53 of the lead holding member 50, the fixing screw 120 of the switching element 33 can be fully fastened. As a result, the lead 33b can be easily inserted through the lead insertion hole 53 of the lead holding member 50.

Further, after the lead holding member 50 is attached, the fixing screw 120 can be loosened without removing the lead holding member 50 for maintenance or the like.

In the lead holding member 50, the connection member holding portion 56 which holds the motor connection member 55 that connects the terminal of the motor 12 and the circuit board 30 is formed. Therefore, even when the lead holding member 50 is provided, the terminal of the motor 12 and the circuit board 30 can be connected to each other via the motor connection member 55.

Furthermore, in the motor connection member 55, the motor side connection portion 55a and the board side connection portion 55b which are disposed at different positions are linked to each other by the linking portion 55c. With the configuration, while the motor side connection portion 55a of the motor connection member 55 is disposed in accordance with the position of the terminal of the motor 12, in accordance with the connection position with the circuit board 30 side, the board side connection portion 55b of the motor connection member 55 can be disposed. In other words, the degree of freedom of the size of the circuit board 30 or the layout of the wiring patterns can be enhanced.

In addition, the lead holding member 50 is fixed by the bolt 130 in the vicinity of the motor side connection portion 55a of the motor connection member 55. Accordingly, the terminal of the motor 12 and the motor connection member 55 can be stably linked to each other.

Above, although the embodiments of the present invention have been described in detail with reference to the drawings, the respective configurations and combinations thereof in the respective embodiments are merely examples, and additions, omissions, substitutions, and other changes of configurations are possible within the scope that does not depart from the gist of the present invention. In addition, the present invention is not limited by the embodiments, but is limited only by the claims.

For example, the layout or shape of the lead insertion hole 53 or the motor connection member 55 in the lead holding member 50 can be appropriately changed in accordance with the arrangement of the switching element 33, the terminal of the motor 12, the wiring pattern of the board main body 32, and the like.

In addition, in the embodiment, the motor connection member 55 is held by the lead holding member 50, the terminal of the motor 12 and the circuit board 30 are connected to each other via the motor connection member 55, but the present invention is not limited thereto. The motor connection member may be provided on the circuit board 30 side. In addition, without providing the motor connection member, it is also possible to directly connect the terminal of the motor 12 and the wiring pattern of the circuit board 30.

In addition, the configuration of each part of the electric compressor 10 can be appropriately changed.

Furthermore, although the air conditioner for vehicles provided with the electric compressor 10 was shown as an example, the present invention is not limited thereto, and the same configuration can also be applied to a refrigeration system provided with the electric compressor 10.

INDUSTRIAL APPLICABILITY

According to the electric compressor, it becomes possible to easily and reliably connect a plurality of leads of a switching element to a circuit board to improve the efficiency of assembly work.

REFERENCE SIGNS LIST

10 Electric compressor
11 Casing
12 motor
13 Compression mechanism
14 Driving circuit portion
15 Power source
18 Driving circuit accommodation portion
18a Bottom portion
18b Outer peripheral wall portion
18c Opening portion
20 Capacitor unit
22 Housing
23 Harness side terminal
24 Board side terminal
30 Circuit board
31 Through-hole
32 Board main body
33, 33A, 33B, 33C, 33D, 33E, 33F Switching element
33a Element main body
33b Lead
34 PN terminal forming portion
35 Electronic component
50 Lead holding member
51 Opening portion
52 Thick portion
53 Lead insertion hole
55 Motor connection member
55a Motor side connection portion (first end portion)
55b Board side connection portion (second end portion)
55c Linking portion
56 Connection member holding portion
57 Terminal insertion hole
58 Bolt insertion hole
59 Reinforcement rib
60 Cover
61 Through-hole
100 Power source harness
120 Fixing screw
130 Bolt

What is claimed is:

1. An electric compressor comprising:
   a circuit board on which a plurality of switching elements that are configured to convert DC power supplied from an outside into AC power are mounted;
   a motor rotationally driven by the AC power output from the plurality of switching elements, wherein each of the plurality of switching elements includes an element main body;
   a compression mechanism which is driven by the motor and is configured to compress a fluid;
   a lead holding member disposed between the plurality of switching elements and the circuit board; and
   a casing in which a driving circuit accommodation portion that accommodates the circuit board and the lead holding member is formed, wherein the driving circuit accommodation portion includes an opening portion,
   wherein the circuit board includes a plurality of through-holes through which a plurality of leads that extend from the element main bodies are respectively inserted, and
   wherein the lead holding member includes lead insertion holes through which the plurality of leads is inserted such that positions of the plurality of leads are held at positions that correspond to positions of the through-holes,
   wherein the lead holding member interposed between the switching elements and the circuit board is provided so that a part of the element main body of one or more of the switching elements is exposed to the circuit board, and
   wherein the lead holding member is provided with at least one opening portion at a position corresponding to at least one fixing screws that fix at least one element main body when viewed from the opening section of the driving circuit accommodation portion.

2. The electric compressor according to claim 1, wherein each of the lead insertion holes is tapered such that an inner diameter gradually decreases from one of the element main bodies side toward the circuit board side.

3. The electric compressor according to claim 1, wherein the lead holding member covers only a part of the element main bodies so as to expose the fixing screws.

4. The electric compressor according to claim 1, further comprising:
   a motor connection member that electrically connects the motor and the circuit board to each other as a first end portion is connected to the motor and a second end portion is connected to the circuit board,
   wherein the lead holding member includes a connection member holding portion that holds the motor connection member so as to hold a position of the second end portion at a position that corresponds to a connection position with the circuit board.

* * * * *